(12) United States Patent
Yamashita et al.

(10) Patent No.: US 7,573,394 B2
(45) Date of Patent: Aug. 11, 2009

(54) INTERNAL SHORT CIRCUIT DETECTION BASED ON DETECTION OF OPEN CIRCUIT VOLTAGES OF BATTERY MODULES

(75) Inventors: Toshiyuki Yamashita, Toyohashi (JP); Masato Onishi, Toyohashi (JP)

(73) Assignee: Panasonic EV Energy Co., Ltd., Kosai-shi (JP)

( * ) Notice: Subject to any disclaimer, the term of this patent is extended or adjusted under 35 U.S.C. 154(b) by 401 days.

(21) Appl. No.: 11/646,872

(22) Filed: Dec. 27, 2006

(65) Prior Publication Data

US 2007/0146151 A1 Jun. 28, 2007

(30) Foreign Application Priority Data

Dec. 27, 2005 (JP) ............................. 2005-375973

(51) Int. Cl.
*G08B 21/00* (2006.01)

(52) U.S. Cl. ..................................... 340/636.1; 702/63

(58) Field of Classification Search ............. 340/636.1, 340/636.15, 636.19, 636.2; 702/63; 320/107, 320/127
See application file for complete search history.

(56) References Cited

U.S. PATENT DOCUMENTS 5,831,945 A * 11/1998 Shinbori et al. ............... 369/19
7,471,065 B2 * 12/2008 Emori et al. ................. 320/116

FOREIGN PATENT DOCUMENTS

JP 2002-22778 1/2002

* cited by examiner

*Primary Examiner*—Jeffery Hofsass
(74) *Attorney, Agent, or Firm*—Christensen O'Connor Johnson Kindness PLLC

(57) ABSTRACT

A battery inspection device inspects for internal short circuits in a battery. The conditions of battery modules B are inspected by measuring open circuit voltage signals of the battery modules that form a battery stack. The open circuit voltage signals are supplied to a detection circuit through voltage signal lines each prepared for each battery module. A voltage signal line and an address signal line A for passing an address signal to set an address which identifies the battery stack using a signal supplied from a signal source share a single line extending between the battery module and the detection circuit, and thus the number of signal lines is reduced.

15 Claims, 5 Drawing Sheets

|  | PIN NUMBER | | | |
|---|---|---|---|---|
| VOLTAGE SIGNAL | com | 1 | 26 | com | VOLTAGE SIGNAL |
| | V21 | 2 | 27 | V23 | |
| | V19 | 3 | 28 | V25 | |
| | V17 | 4 | 29 | V27 | |
| | V15 | 5 | 30 | V29 | |
| ADDRESS SIGNAL | com | 6 | 31 | V30 | VOLTAGE SIGNAL |
| | B1 | 7 | 32 | V28 | |
| | B2 | 8 | 33 | V26 | |
| | B3 | 9 | 34 | V24 | |
| | B4 | 10 | 35 | V22 | |
| | B5 | 11 | 36 | V20 | |
| | B6 | 12 | 37 | V18 | |
| | B7 | 13 | 38 | | |
| | B8 | 14 | 39 | | |
| | B9 | 15 | 40 | V16 | VOLTAGE SIGNAL |
| | B10 | 16 | 41 | V14 | |
| | B11 | 17 | 42 | V12 | |
| | B12 | 18 | 43 | V10 | |
| | B13 | 19 | 44 | V8 | |
| | B14 | 20 | 45 | V6 | |
| | B15 | 21 | 46 | V4 | |
| | B16 | 22 | 47 | V2 | |
| | B17 | 23 | 48 | V1 | |
| VOLTAGE SIGNAL | V9 | 24 | 49 | V3 | |
| | V7 | 25 | 50 | V5 | |

Fig. 2
Related Art

|  |  | PIN NUMBER |  |  |  |
|---|---|---|---|---|---|
| VOLTAGE SIGNAL | com | 1 | 26 | com | VOLTAGE SIGNAL |
|  | V21(+) | 2 | 27 | V23(+) |  |
|  | V19(+) | 3 | 28 | V25(+) |  |
|  | V17(+) | 4 | 29 | V27(+) |  |
|  | V15(+) | 5 | 30 | V29(+) |  |
|  |  | 6 | 31 | V30(−) |  |
| ADDRESS SIGNAL  VOLTAGE SIGNAL | B1/V32(−) | 7 | 32 | V28(−) |  |
|  | B2/V34(−) | 8 | 33 | V26(−) |  |
|  | B3/V36(−) | 9 | 34 | V24(−) |  |
|  | B4/V38(−) | 10 | 35 | V22(−) |  |
|  | B5/V40(−) | 11 | 36 | V20(−) |  |
|  | B6/V31(−) | 12 | 37 | V18(−) |  |
|  | B7/V33(−) | 13 | 38 |  |  |
|  | B8/V35(−) | 14 | 39 |  |  |
|  | B9/V37(−) | 15 | 40 | V16(−) | VOLTAGE SIGNAL |
|  | B10/V39(−) | 16 | 41 | V14(−) |  |
|  | B11 | 17 | 42 | V12(−) |  |
|  | B12 | 18 | 43 | V10(−) |  |
|  | B13 | 19 | 44 | V8(−) |  |
|  | B14 | 20 | 45 | V6(−) |  |
|  | B15 | 21 | 46 | V4(−) |  |
| VOLTAGE SIGNAL  ADDRESS SIGNAL | V13(+)/B16 | 22 | 47 | V2(−) |  |
|  | V11(+)/B17 | 23 | 48 | V1(+) |  |
|  | V9 | 24 | 49 | V3(+) |  |
|  | V7 | 25 | 50 | V5(+) |  |

Fig. 3

INTERNAL SHORT CIRCUIT DETECTION BASED ON DETECTION OF OPEN CIRCUIT VOLTAGES OF BATTERY MODULES

PRIORITY INFORMATION

This application claims priority to Japanese Patent Application No. 2005-375973, filed on Dec. 27, 2005, which is incorporated herein by reference in its entirety.

BACKGROUND OF THE INVENTION

1. Field of the Invention

The present invention relates to a battery inspection device for inspecting a condition of a battery by measuring an open circuit voltage of the battery.

2. Description of the Related Art

In the process of manufacturing batteries, such as, for example, rechargeable (secondary) batteries, it may be impossible to completely prevent the mixing of metallic foreign matter into positive electrode material or the like. Mixed metallic foreign matter dissolves in positive electrodes, and is deposited in negative electrodes. Such deposition of metallic foreign matter in negative electrodes may cause occurrence of minute internal short circuiting (hereinafter, referred to as "particle shorts").

Conventional methods for screening out defective conditions, such as particle shorts, include a method that uses an open circuit terminal voltage (OCV, or Open Circuit Voltage) of a battery, and in which OCVs are measured before and after aging during which spontaneous discharge of a completed battery occurs.

FIG. 5 shows a circuit structure of an inspection system that inspects for particle shorts by measuring OCVs before and after aging during which spontaneous discharge of a battery occurs.

As shown in FIG. 5, the inspection system is formed by connecting, via a pin connector 20, a voltage measurement unit 10 and a fixing jig 30 for fixing one battery stack that includes a plurality of battery modules $B_1$ through $B_n$ to be inspected (hereinafter, simply referred to as "battery module B" where there is no need to distinguish them). In addition to the fixing jig 30, an address switch 40 for setting a jig address to identify the fixing jig 30, or, in other words, to uniquely identify the battery stack to which that jig is attached, is connected to the pin connector 20.

The voltage measurement unit 10 includes selection switches $SWa_1$ through $SWa_n$ respectively provided for voltage signal lines connected to the battery modules that form the battery stack; an A/D conversion circuit 16 to which open circuit voltage signals of the battery modules output through the voltage signal lines are input, and which converts the input signal into a digital signal; and a CPU 12 to which the digital signal from the A/D conversion circuit 16 is input, and which detects open circuit voltages of the battery modules. The voltage measurement unit 10 further includes a DC signal source that supplies a signal to the address switch 40; and address signal lines for outputting, to the CPU 12, address signals generated by the address switch 40.

As shown in the figure, the address switch 40 is formed by connecting a plurality of switches $SWb_1$ through $SWb_m$ in parallel with each other, and a signal line connected to a positive electrode side of the DC signal source is branched off for each of the switches $SWb_1$ through $SWb_m$ that form the address switch 40, and is connected to one end of each switch SWb. Another end of each switch is connected in common to a negative electrode side of the DC signal source. The signal line, which is branched off for each switch and connected to each switch SWb, is provided with photocouplers $PT_1$ through $PT_m$ that are formed by light-emitting diodes and photodetectors, and output signal lines from the photocouplers are connected in common to the CPU 12. A number "m" of switches SWb that form the address switch 40 can assign an "m" bit address. To set an address unique to each fixing jig, or to each battery stack, the switches SWb of the address switch 40 are turned on or off. For example, by turning on the switch $SWb_1$ and turning off the other switches, it is possible to assign an address having "m" bits, the least significant bit of which is "1" and the other more significant bits are "0". After the address is assigned by the address switch 40, the selection switches $SWa_1$ through $SWa_n$ for the voltage signal lines are sequentially turned on or off to thereby sequentially select the battery modules, from which open circuit voltage signals are fed into the CPU 12.

The CPU 12 detects open circuit voltages of the battery modules that form the battery stack which is identified by the address generated by the address switch 40 to store the detected voltages in a memory 50, and detects the degree of drop in open circuit voltages between before and after aging to determine the presence of particle shorts in the battery modules and to further determine whether the battery stack is defective or non-defective.

For an inspection system with such a structure, a battery stack to be inspected is formed, for example, of 30 battery modules, and an address is represented by 15 bits. The address signal lines for outputting address signals to set an address and the voltage signal lines for outputting open circuit voltage signals are independent of one another, and the respective signal lines are housed in one pin connector to output open circuit voltage signals and address signals to the voltage measurement unit 10. Thus, to inspect a battery stack formed of, for example, 30 battery modules, a total of 47 signal lines (30+1 for voltage signal lines and 15+1 for address signal lines) are adequate, and therefore it is sufficient if a pin connector with, for example, 50 pins is used.

However, there has in recent years been a trend for the number of battery modules required in one battery stack to increase. Especially recently, there is a demand for higher power battery stacks to meet requirements from vehicles on which battery stacks are mounted, the number of battery modules included in a battery stack tends to increase, and there is an arising need to efficiently inspect for the presence of particle shorts not only in a battery stack with, for example, 30 battery modules, but also in a battery stack with more than 30 battery modules. For example, when a battery stack is formed of 40 battery modules, a conventional pin connector with 50 pins cannot accommodate address signal lines and voltage signal lines if they are provided independently. Although it is possible to prepare a new pin connector with an increased number of pins, costs will be incurred for preparation of a battery inspection device provided with a new pin connector.

Japanese Patent Laid-Open Publication No. 2002-22778 discloses a device for measuring voltages of multiple storage batteries in which a voltage value detected from a target of voltage detection at the side of a transmitter is transmitted after conversion into time information, and the time information is received at the side of a receiver to convert that time information into a detected voltage value. According to this conventional technique, a power supply line also serves as an information output line so that a reduction in number of cable lines is achieved.

However, this technique disadvantageously requires performing additional processing such as conversion of a voltage value into time information.

SUMMARY OF THE INVENTION

An object of the present invention is to provide a battery inspection device for inspecting a condition of a battery, with which a greater quantity of battery modules can be inspected at a time, or which is also capable of efficiently inspecting a plurality of battery stacks having mutually different numbers of stacked battery modules.

According to one aspect of the present invention, there is provided a battery inspection device for inspecting a condition of a battery by measuring an open circuit voltage of the battery, the battery inspection device comprising a voltage signal line for outputting an open circuit voltage signal of the battery; and an address signal line for outputting an address signal to set an address which identifies the battery. The voltage signal line and the address signal line share a single line.

Further, according to another aspect of the present invention, there is provided a battery inspection device for inspecting conditions of batteries by measuring open circuit voltages of battery modules that form a battery stack, the battery inspection device comprising address signal lines for outputting address signals to set an address which identifies the battery stack; and voltage signal lines connected to the battery modules for outputting open circuit voltage signals of the battery modules. One of the address signal lines shares a single line with one of the voltage signal lines.

Further, according to still another aspect of the present invention, there is provided a voltage measurement unit for inspecting conditions of battery modules by measuring open circuit voltages of the battery modules that form a battery stack, the voltage measurement unit comprising voltage signal input terminals each prepared for each battery module, to which open circuit voltage signals of the battery modules are input; and at least one or more address signal input terminals to which an address signal to set an address which identifies the battery stack is input. At least one of the address signal input terminals shares a single terminal with one of the voltage signal input terminals.

Further, according to still another aspect of the present invention, there is provided a fixing jig for fixing battery modules that form a battery stack, the fixing jig being connectable to a voltage measurement unit for inspecting conditions of the battery modules by measuring open circuit voltage signals of the battery modules, the fixing jig comprising at least one or more address signal lines for outputting an address signal to set an address which identifies the fixing jig; and voltage signal lines each prepared for each battery module for outputting open circuit voltage signals of the battery modules. One of the address signal lines is connected to one of the voltage signal lines. Further, an address signal output through an address signal line connected to a voltage signal line and an open circuit voltage signal output through the voltage signal line to which that address signal line is connected are output via a same output terminal to the voltage measurement unit.

BRIEF DESCRIPTION OF THE DRAWINGS

A preferred embodiment of the present invention will be described in further detail based on the following drawings, wherein:

FIG. 2 is a conventional table showing types of signals for respective terminals in a pin connector with 50 pins for use in a voltage inspection device;

FIG. 3 is a table showing types of signals for respective terminals for a case where a pin connector with 50 pins is used in a voltage inspection device according to the preferred embodiment;

DESCRIPTION OF PREFERRED EMBODIMENT

A preferred embodiment of the present invention (hereinafter, referred to simply as "the embodiment") will be described below with reference to the drawings.

According to the present embodiment, a battery inspection device measures OCVs before and after aging during which spontaneous discharge occurs in a plurality of battery modules (for example, secondary (rechargeable) batteries, such as nickel-metal hydride batteries) that form a battery stack, calculates the degree of voltage drop between before and after the aging based on the measured OCVs, and inspects for particle shorts in the battery modules based on the calculated degree of voltage drop. The term "battery module" as used in the present embodiment refers to a battery which has a single cell, or a battery which has a plurality of cells and a pair of external positive and negative electrode terminals.

In the present embodiment, in order that the voltages of the battery modules that form the battery stack may be measured at one time or at one operation, the position of the battery modules is collectively fixed while the measurement is performed. Here, a component for collectively fixing the battery modules is referred to as "fixing jig".

Figure 1:
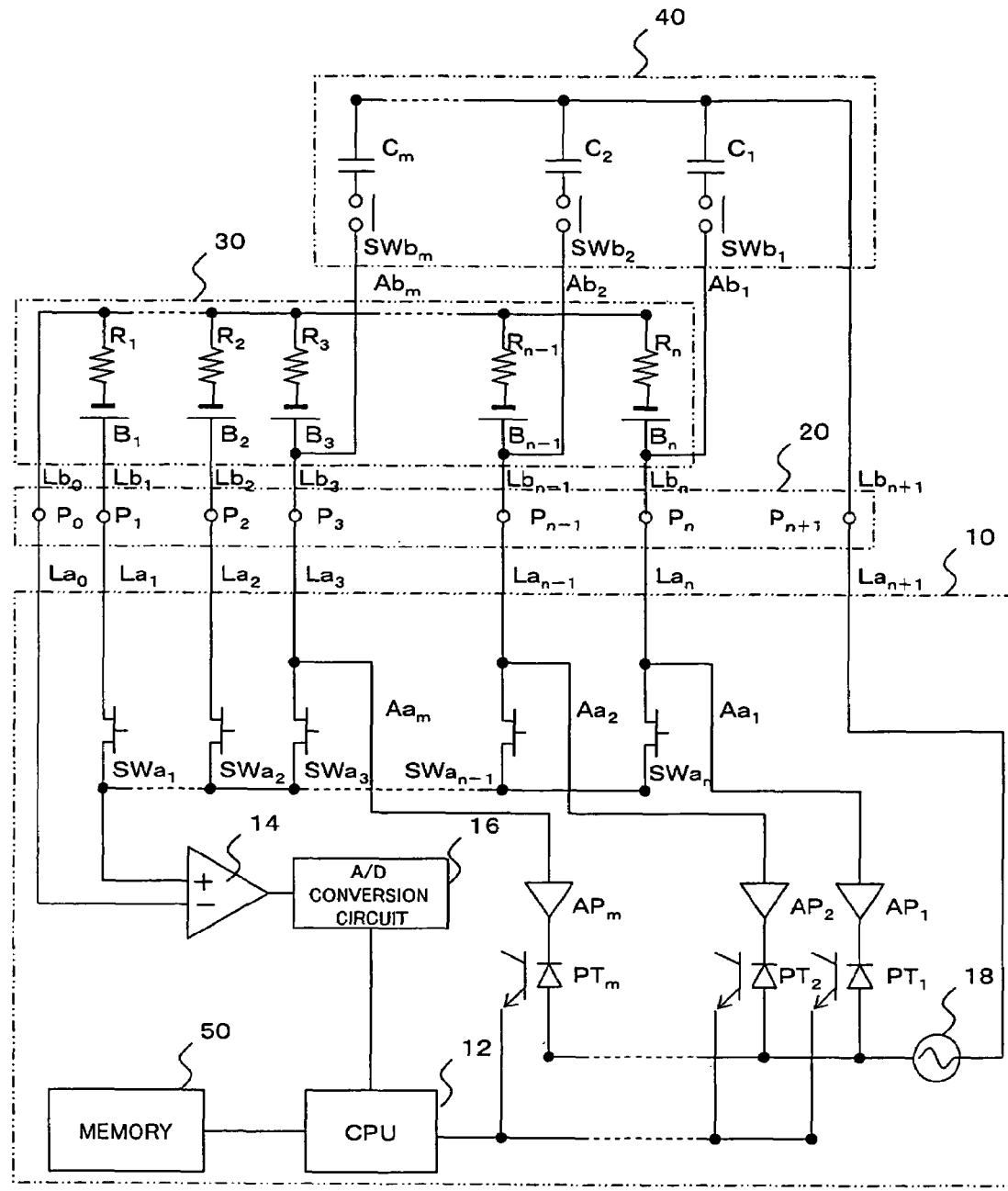
FIG. 1 is a diagram showing a circuit structure of a battery inspection device according to a preferred embodiment of the present invention.

FIG. 1 is a diagram showing a circuit structure of a battery inspection device according to the present embodiment.

As shown in FIG. 1, the battery inspection device includes a voltage measurement unit 10; a fixing jig 30 for fixing one battery stack that is formed by stacking a plurality of battery modules $B_1$ through $B_n$ to be inspected (hereinafter referred to generally as "battery module B" where there is no need to distinguish among the individual modules); and an address switch 40 for outputting address signals to set a jig address which uniquely identifies the fixing jig or the battery stack. The voltage measurement unit 10 and the fixing jig 30 are electrically connected to each other via a pin connector 20 which has a number "n" of pins, and the voltage measurement unit 10 and the address switch 40 are also electrically connected to each other via this pin connector 20.

The voltage measurement unit 10, to which address signals are input through the address switch 40, generates a jig address. Further, the voltage measurement unit 10, to which open circuit voltage signals are input from the battery modules B, detects OCVs of the battery modules B and registers the OCVs of the battery modules B in a memory 50 in association with the generated jig address.

In the present embodiment, among the pins included in the pin connector 20, a pin for outputting an address signal and a pin for outputting an open circuit voltage signal from a battery module B share a single pin. In other words, a signal line for outputting an address signal and a signal line for outputting an open circuit voltage signal share a single line. Thus, a greater quantity of battery modules can be inspected at a time, or it is also possible to efficiently inspect a plurality of battery stacks having mutually different numbers of stacked battery modules.

The voltage measurement unit 10 includes a common line $La_0$ for voltage signals which is connected in common to negative electrode sides of the battery modules B that form the battery stack; voltage signal lines $La_1$ through $La_n$ connected to positive electrode sides of the battery modules B that form the battery stack; selection switches $SWa_1$ through $SWa_n$ respectively provided for the voltage signal lines La; an analog-to-digital (A/D) conversion circuit 16 to which open circuit voltage signals of the battery modules B output through the voltage signal lines La are input through an operational amplifier 14, and which converts the input signals into digital signals; a CPU 12 to which the digital signals from the A/D conversion circuit 16 are input, and which detects open circuit voltages of the battery modules B; and a memory 50 for storing values of the detected open circuit voltages of the battery modules B.

The common line $La_0$ for voltage signals is connected to a minus (−) input terminal of the operational amplifier 14. In addition, the voltage signal lines $La_1$ through $La_n$ are connected to a plus (+) input terminal of the operational amplifier 14 via the selection switches $SWa_1$ through $SWa_n$, respectively. With such a structure, OCV signals of the battery modules B for which the selection switches SWa are in the "on" condition are output from an output terminal of the operational amplifier 14, and are input to the A/D conversion circuit 16. By turning on the selection switches $SWa_1$ through $SWa_n$ in turn, the CPU 12 receives OCV signals of the battery modules B from the A/D conversion circuit 16.

The voltage measurement unit 10 further includes an alternating current oscillator 18 for outputting alternating current signals (for example, 1.2 kHz) which serves as a signal source for address signals, and a common line $La_{n+1}$ for address signals which is connected to one end of the alternating current oscillator 18.

Address signal lines $Aa_1$ through $Aa_m$ for outputting address signals are connected to the voltage signal lines $La_3$ through $La_n$ at positions closer to the battery modules B than the selection switches $SWa_3$ through $SWa_n$. Alternating current signals output from the alternating current oscillator 18 are input to the address signal lines Aa through an address switch 40. Further, the address signal lines Aa are connected to photocouplers $PT_1$ through $PT_m$ via amplifiers $AP_1$ through $AP_m$, and output signal lines from the photocouplers $PT_1$ through $PT_m$ are respectively connected in common to another end of the alternating current oscillator 18. With each photocoupler PT being formed by a light-emitting diode and a photodetector, an alternating current signal output from the alternating current oscillator 18 is input to a light-emitting diode when any one of switches SWb included in the address switch 40 which will be described below is in the "on" condition, and the light-emitting diode converts the alternating current signal into an optical signal. The photodetector converts the optical signal into an electrical signal, and outputs the electrical signal as an address signal to the CPU 12. The CPU 12 generates a jig address of "m" bits by sequentially selecting the photocouplers $PT_1$ through $PT_m$ to detect whether the switches $SWb_1$ through $SWb_m$ are on or off based on whether or not an electrical signal is received.

The fixing jig 30 has voltage signal lines $Lb_1$ through $Lb_n$ connected to positive electrode sides of the battery modules B, and has a common line $Lb_0$ for voltage signals which is connected in common to negative electrode sides of the battery modules B. Address signal lines $Ab_1$ through $Ab_m$ extending from the address switch 40 are connected to the voltage signal lines $Lb_3$ through $Lb_n$. Ends of resistor elements R are respectively connected to the negative electrode sides of the battery modules B, and other ends of the resistor elements R are respectively connected to the common line $Lb_0$ for voltage signals. The resistor elements R (for example, 4.7 kΩ) are thus provided to prevent address signals input through the address signal lines Ab to the voltage signal lines Lb from being supplied to the battery modules B. Thus, address signals output through the voltage signal lines $Lb_3$ through $Lb_n$ are respectively input via the pin connector 20 to the voltage signal lines $La_3$ through $La_n$ provided in the voltage measurement unit 10.

The address switch 40 includes switches $SWb_1$ through $SWb_m$ connected in parallel with each other; capacitors $C_1$ through $C_m$ connected to ends of the switches SWb (each capacitor C having a capacitance of, for example, 0.1 μF); a common line $Lb_{n+1}$ for address signals which is connected in common to other ends of the capacitors $C_1$ through $C_m$; and the address signal lines $Ab_1$ through $Ab_m$ respectively connected to other ends of the switches SWb. As described above, the address signal lines Ab are respectively connected to the voltage signal lines Lb provided in the fixing jig 30. The common line $Lb_{n+1}$ for address signals and the common line $La_{n+1}$ for address signals on the side of the voltage measurement unit 10 are electrically connected to each other via the pin connector 20.

As described above, the CPU 12 sequentially selects the photocouplers PT to receive address signals to thereby generate a jig address, and further sequentially turns on the selection switches SWa to receive OCV signals of the battery modules B to thereby detect open circuit voltages of the battery modules B.

FIG. 2 is a conventional table showing types of signals for respective pins in a pin connector with 50 pins for use in a voltage inspection device. Referring to FIG. 2, open circuit voltage signals are input to and output from pins to which "V" is assigned. Also, address signals are input to and output from pins to which "B" is assigned. Further, "com" in FIG. 2 denotes a common line (this similarly applies to FIG. 3 which will be described below). As shown in FIG. 2, one of "V", "B", or "com" is assigned to each pin. In other words, in a conventional voltage inspection device, different pins are respectively assigned for voltage signals and address signals.

On the other hand, FIG. 3 is a table showing types of signals for respective pins (terminals) in a pin connector with 50 pins for use in a voltage inspection device according to the present embodiment. In the voltage inspection device according to the present embodiment as shown in FIG. 3, "V" and "B" are assigned to respective pins with pin numbers 7-16, 22, and 23. In other words, voltage signals and address signals are input to and output from each of these pins. Thus, according to the present embodiment, a shared signal line that allows passage of address signals and voltage signals is achieved. Therefore, according to the present embodiment, in cases where a pin connector with, for example, 50 pins is used, it is possible to inspect for particle shorts in one battery stack having a maximum number of 48 battery modules B at a time (48 is the number of pins excluding pins for common lines).

Further, because a signal line shared for address signals and voltage signals can also be used as a signal line for passing only address signals, it is also possible to inspect for particle shorts in a battery stack formed by a smaller number of battery modules in a similar manner to that used in conventional cases, without changing the number of pins of the pin connector. In other words, a voltage measurement unit which is compatible with a conventional pin connector can be used to inspect for particle shorts in both a conventional battery stack and a battery stack formed by a larger number of battery modules than the conventional battery stack.

Further, because the number of signal lines for passing address signals can be increased as a result of shared use of a signal line for address signals and voltage signals, the number of bits which represent a jig address can also be increased, and the settable address range can be widened. Therefore, it is possible to simultaneously inspect a greater number of battery stacks for particle shorts by preparing a larger number of fixing jigs than in conventional configurations.

Figure 5:
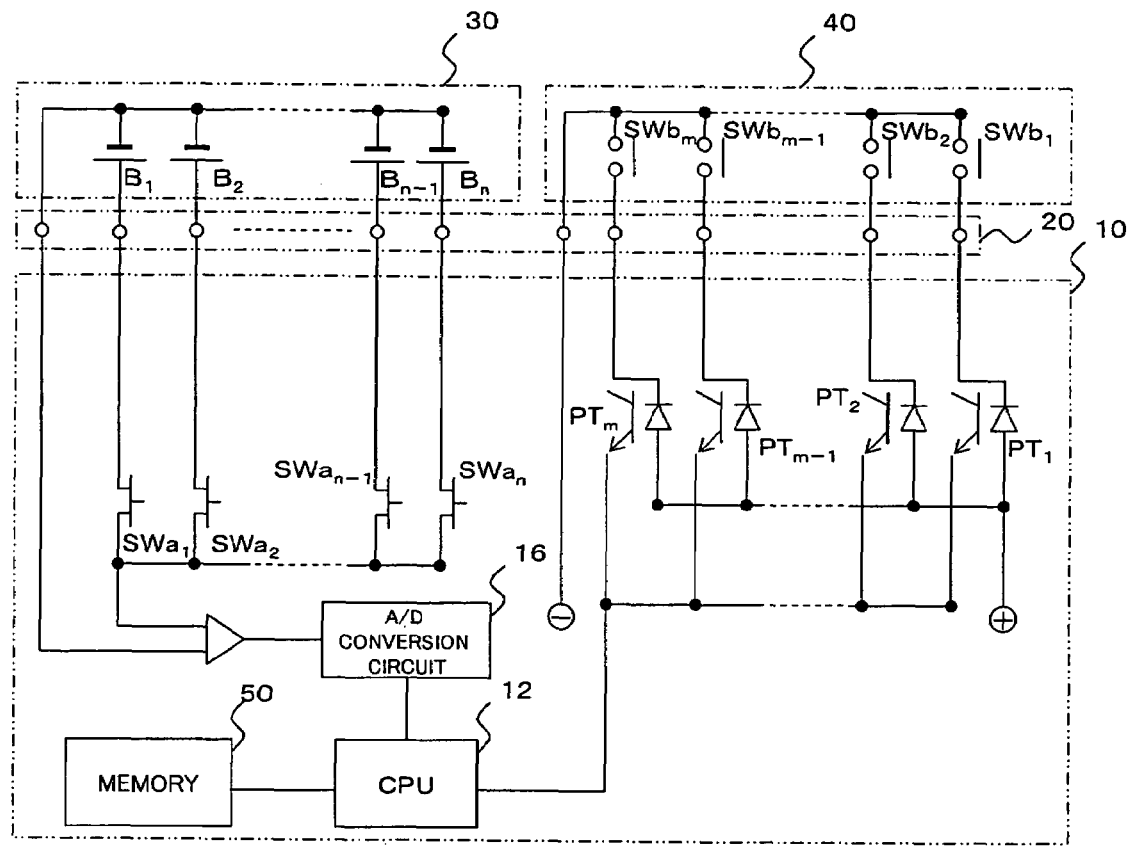
FIG. 5 is a diagram showing a circuit structure according to the related art.

In addition, the CPU 12 sequentially selects the photocouplers PT to receive address signals to generate a jig address, and sequentially turns on the selection switches SWa to receive voltage signals of battery modules to measure the voltages of the respective battery modules. This processing procedure of the CPU 12 does not significantly differ from the processing procedure of the CPU 12 shown in FIG. 5. As a result, because it is possible to reduce the need to rewrite the program to conform to changes in the processing performed by the CPU 12, a reduction in cost can be achieved.

Figure 4:
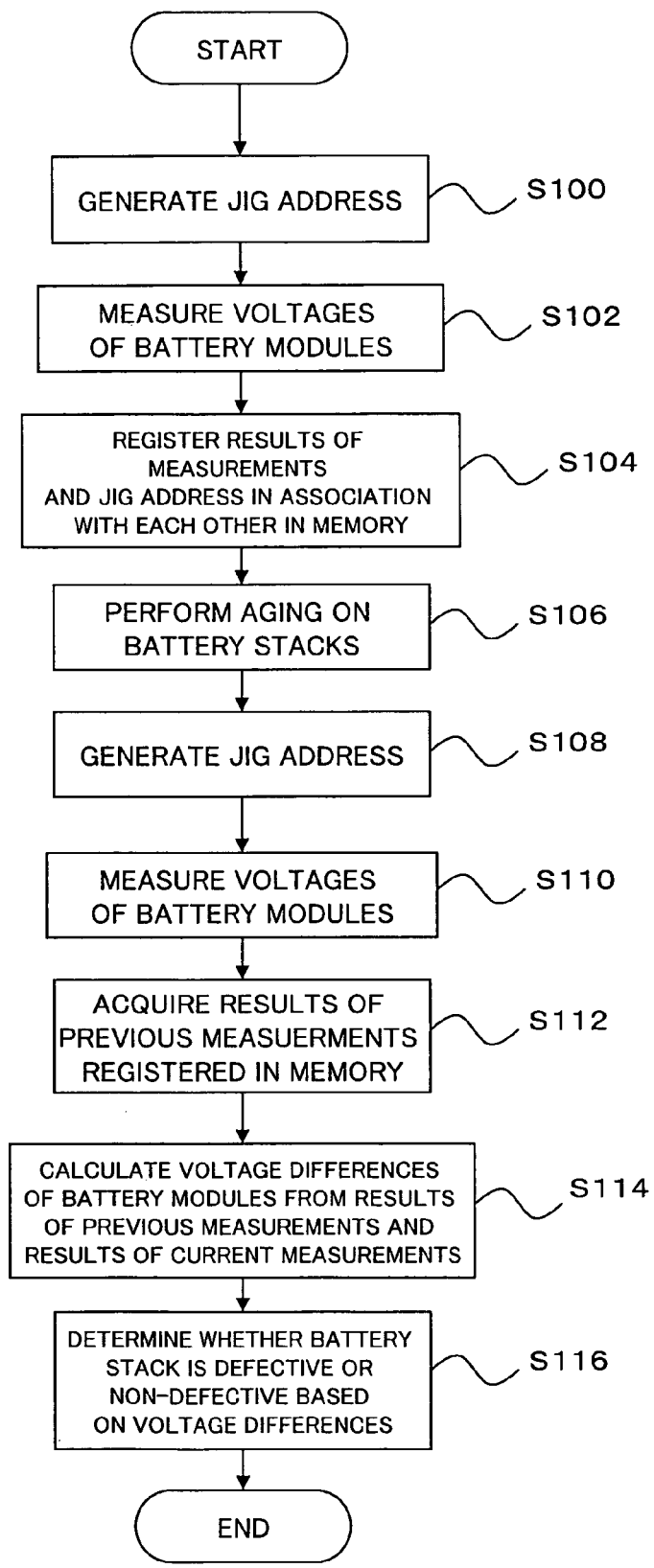
FIG. 4 is a flowchart showing the flow of inspection processing performed in a voltage inspection device according to the preferred embodiment.

The flow of inspection processing of a voltage inspection device according to the present embodiment will be described with reference to the flowchart shown in FIG. 4.

An inspector attaches a battery stack to be inspected to the fixing jig 30, and connects the fixing jig 30 and the voltage measurement unit 10 via the pin connector 20. After that, in response to issuance of an inspection start instruction by the inspector to the voltage measurement unit 10, the voltage measurement unit 10 performs the inspection processing as shown in FIG. 4.

More specifically, the voltage measurement unit 10 sequentially selects the photocouplers $PT_1$ through $PT_m$ to ascertain whether the switches $SWb_1$ through $SWb_m$ are on or off based on whether or not an electrical signal is received, and generates (S100) a jig address having "m" bits in which "1" is set when the switch is on, and "0" is set when the switch is off. Next, the voltage measurement unit 10 measures (S102) the voltages of the battery modules B by turning on the selection switches $SWa_1$ through $SWa_n$ in turn, and registers (S104) the voltage values of the battery modules B as results of measurements in the memory 50 in association with the generated jig address.

Then, the battery stack is subjected to aging (S106). During the aging of this battery stack, the voltage measurement unit 10 similarly performs voltage measurements on other battery stacks while sequentially changing the fixing jig 30.

After the aging of the battery stacks is completed, the fixing jig 30 that fixes a battery stack which has been subjected to aging is again connected to the voltage measurement unit 10 to continue the inspection.

In other words, the voltage measurement unit 10 generates (S108) a jig address, and measures (S110) voltages of battery modules B. Next, using the jig address generated in step S108 as a search key, the voltage measurement unit 10 acquires (S112) from the memory 50 the results of the previous measurements with respect to the battery modules B which are measured in step S110. The voltage measurement unit 10 calculates (S114) voltage differences of the battery modules B from the acquired results of the previous measurements and the results of the current measurements. Further, the voltage measurement unit 10 determines whether or not the calculated voltage differences include a value equal to or greater than a predetermined threshold to determine (S116) that the inspected battery stack is "non-defective" when a value equal to or greater than the predetermined threshold is not included, and that the inspected battery stack is "defective" when a value equal to or greater than the predetermined threshold is included.

According to the above-described inspection procedure, the battery inspection device of the present embodiment is capable of inspecting for particle shorts in the battery modules which form a battery stack, and is capable of screening to select battery stacks which have no particle short.

What is claimed is:

1. A battery inspection device for inspecting a condition of a battery by measuring an open circuit voltage of the battery, the battery inspection device comprising:
    a voltage signal line for outputting an open circuit voltage signal of the battery; and
    an address signal line for outputting an address signal to set an address which identifies the battery,
    wherein the voltage signal line and the address signal line share a single line.

2. A battery inspection device for inspecting conditions of batteries by measuring open circuit voltages of battery modules that form a battery stack, the battery inspection device comprising:
    address signal lines for outputting address signals to set an address which identifies the battery stack; and
    voltage signal lines connected to the battery modules for outputting open circuit voltage signals of the battery modules,
    wherein one of the address signal lines shares a single line with one of the voltage signal lines.

3. A battery inspection device according to claim 1, wherein the address signal is an alternating current signal.

4. A battery inspection device according to claim 1, wherein the voltage signal line which shares a single line with the address signal line is provided with a resistor element which prevents the address signal from being supplied to a battery module side.

5. A battery inspection device for inspecting conditions of battery modules or a battery stack, which is formed by stacking a plurality of battery modules, by detecting open circuit voltages of the battery modules of the battery stack, the battery inspection device comprising:
    voltage signal lines respectively connected to the battery modules for outputting open circuit voltage signals of the battery modules;
    a detection circuit for detecting open circuit voltage signals of the battery modules which are output through the voltage signal lines;
    a signal source;
    an address signal generating circuit for generating an address signal to uniquely identify the battery stack using a signal supplied from the signal source; and
    address signal lines for outputting, to the detection circuit, address signals generated from the address signal generating circuit,
    wherein at least one of the address signal lines shares, with one of the voltage signal lines, a part of a signal line extending between a battery module and the detection circuit.

6. A battery inspection device according to claim 5, wherein
    each of the voltage signal lines connects between an output terminal on a side of each battery module and an input terminal on a side of the detection circuit; and
    the address signal line and the voltage signal line share a single line extending between the output terminal and the input terminal.

7. A battery inspection device according to claim 5, wherein
- the signal source is an alternating current signal source;
- the address signal generating circuit generates an alternating current address signal as the address signal; and
- at least a battery module for which the address signal line and the voltage signal line share a single line, and which is included in the battery modules, has connected thereto a resistor element for suppressing supply of the alternating current address signal to the battery module.

8. A voltage measurement unit for inspecting conditions of battery modules by measuring open circuit voltages of the battery modules that form a battery stack, the voltage measurement unit comprising:
- voltage signal input terminals each prepared for each battery module, to which open circuit voltage signals of the battery modules are input; and
- at least one or more address signal input terminals to which an address signal to set an address which identifies the battery stack is input, wherein
- at least one of the address signal input terminals shares a single terminal with one of the voltage signal input terminals.

9. A voltage measurement unit according to claim 8, wherein the address signal is an alternating current signal.

10. A voltage measurement unit according to claim 9, further comprising an alternating current oscillator which serves as an oscillating source of the alternating current signal.

11. A voltage measurement unit according to claim 8, further comprising:
- a signal line connected to a voltage signal input terminal which shares a single terminal with an address signal input terminal;
- a voltage signal line branched off from the signal line for outputting an open circuit voltage signal;
- an address signal line branched off from the signal line for outputting an address signal;
- a voltage measurement section for measuring an open circuit voltage of a battery based on the open circuit voltage signal output through the voltage signal line;
- an address generating section for generating an address based on the address signal output through the address signal line; and
- a measurement result registering section for registering, in a memory, a value of a measured open circuit voltage of each battery module and the generated address in association with each other.

12. A fixing jig for fixing battery modules that form a battery stack, the fixing jig being connectable to a voltage measurement unit for inspecting conditions of the battery modules by measuring open circuit voltage signals of the battery modules, the fixing jig comprising:
- at least one or more address signal lines for outputting an address signal to set an address which identifies the fixing jig; and
- voltage signal lines each prepared for each battery module for outputting open circuit voltage signals of the battery modules, wherein
- one of the address signal lines is connected to one of the voltage signal lines; and
- an address signal output through an address signal line connected to a voltage signal line and an open circuit voltage signal output through the voltage signal line to which that address signal line is connected are output via a same output terminal to the voltage measurement unit.

13. A fixing jig according to claim 12, wherein the address signal is an alternating current signal.

14. A fixing jig according to claim 12, further comprising a resistor element provided at a point closer to a battery module side than a connection point at which the address signal line is connected to the voltage signal line, wherein the resistor element suppresses supply of the address signal to the battery module side via that connection point.

15. A method for manufacturing a battery stack that is formed by stacking a plurality of battery modules, the method comprising the steps of:
- aging the battery stack;
- detecting open circuit voltages of each battery module before and after the aging; and
- inspecting for presence of a particle short in each battery module based on a degree of voltage drop in the open circuit voltages between before and after the aging to thereby select a non-defective battery stack, wherein
- in the step of detecting open circuit voltages, at least one address signal line for outputting an address signal to set an address which identifies the battery stack shares a single line with one of voltage signal lines connected to the battery modules for outputting open circuit voltages of the battery modules.

* * * * *